350-96.27 SR

PM021 XR 3,624,462

United States Patent

[11] 3,624,462

[72] Inventor William S. Phy
Los Altos Hills, Calif.
[21] Appl. No. 838,882
[22] Filed July 3, 1969
[45] Patented Nov. 30, 1971
[73] Assignee Fairchild Camera and Instrument Corporation
Syosset, N.Y.

[54] FACE-BONDED PHOTOARRAY PACKAGE

4 Claims, 6 Drawing Figs.

[52] U.S. Cl. .................. 317/234 R, 317/234 A, 317/234 E, 317/234 G, 317/234 N, 317/235 N, 174/52 PE, 174/68.5
[51] Int. Cl. .................. H01l 5/00
[50] Field of Search .................. 317/234, 235, 1, 3, 3.1, 4, 4.1, 5, 5.4, 27; 250/211, 217, 227, 238, 239; 174/68.5

[56] References Cited

UNITED STATES PATENTS

| | | | |
|---|---|---|---|
| 3,492,621 | 1/1970 | Yamada et al. | 338/19 |
| 2,839,646 | 6/1958 | Hester | 317/234 X |
| 3,423,594 | 1/1969 | Galopin | 250/211 |
| 3,480,836 | 11/1969 | Aronstein | 317/100 |

*Primary Examiner*—John W. Huckert
*Assistant Examiner*—B. Estrin
*Attorneys*—Roger S. Borovoy and Alan H. MacPherson

ABSTRACT: A fiber-optics shield overlying the principal light-sensitive surface of a photoarray device provides protection from mechanical damage while eliminating unwanted crosstalk between components. The package also provides a member extending from the photoarray to provide for the dissipation of heat.

INVENTOR
WILLIAM S. PHY
BY [signature]
ATTORNEYS

INVENTOR.
WILLIAM S. PHY
BY Roger S. Borovoy
ATTORNEYS

FACE-BONDED PHOTOARRAY PACKAGE

BACKGROUND OF THE INVENTION

1. Field of the Invention

This invention relates to a package for a semiconductor photoarray structure

2. Description of the Prior Art

In many applications of semiconductor photoarray devices, it is desirable to protect the principal light-sensitive surface of the device so that the photoresponse characteristics thereof are not caused to vary. For example, in punched tape or punchedcard applications, a solid object is often placed at or close to the principal surface. Unless great care is taken, the solid object can scratch or otherwise harm the array surface and consequently affect the device photoresponse characteristics. Protection is often provided by the placement of a layer of protective transmissive material over the principal surface. Unfortunately, and depending upon the material used, the protective layer can cause a loss by reflection or absorption, or both, up to approximately 30 percent of the applied light.

It is also desirable in some applications to have light applied to selected portions of the principal surface while keeping other surface portions in the dark. The selective application of light can be accomplished efficiently through use of a plurality of small light sources that are in close proximity to the principal surface. However, because light rays tend to spread out from their source, it has been difficult to prevent light from adjacent light sources from reaching active surface areas of the photoarray other than the area intended to correspond to a particular light source. This phenomenon, which is referred to as crosstalk, interferes with the ability of a plurality of light sources to control accurately the operation of a photoarray.

Moreover, it is desirable that a plurality of electrical contacts be made to selected portions of the principal surface without detrimentally affecting photoresponse, while allowing a hermetic seal to be maintained around the array to provide environmental protection. Also, because many photocomponents are located within a single photoarray, provision must be made for dissipation of heat, which usually is generated in the array during operation.

SUMMARY OF THE INVENTION

The structure of the invention solves the above mentioned problems by providing protection from mechanical damage to the principal light-sensitive surface of the semiconductor photoarray, while eliminating the prior art problem of loss of light due to a protective overlayer. Furthermore, the structure of the invention reduces crosstalk resulting from diffused and reflected light, permits separate electrical contacts to be made to the principal photoarray surface, provides for a hermetic seal, and allows for dissipation of heat.

Briefly, the structure of the invention comprises a semiconductor substrate with a plurality of light-sensitive components located therein and having a principal light-sensitive surface. Overlying the surface is a frame assembly comprising a frame having an opening, and a highly transparent protective layer, preferably of fiber optics material, seated within the frame opening. A housing is provided to support the frame assembly. By a suitable combination of spaced contact bumps located on the semiconductor substrate, protective layer, and frame; spaced interconnect layers extending along the frame and protective layer between the respective contact bumps thereof; and spaced terminal leads extending through the housing and making electrical contact to one of the bumps along the lower surface of the frame, external contact is provided to individual components within the substrate. Attached to another surface of the semiconductor substrate and extending through the housing is a member that provides for dissipation of substrate heat.

DESCRIPTION OF THE PREFERRED EMBODIMENTS

Figure 1:
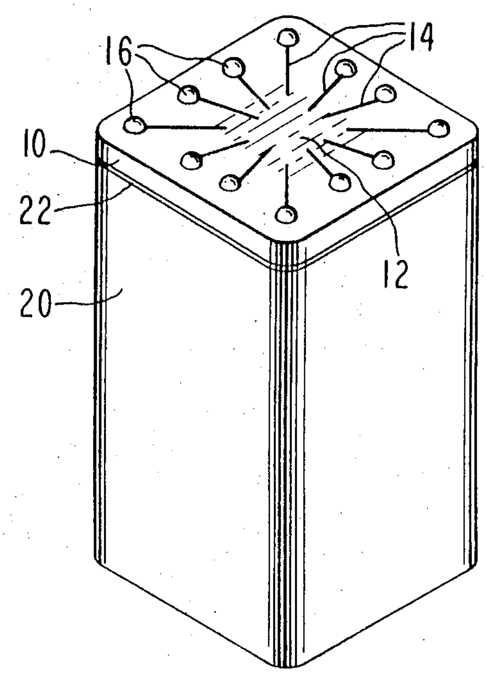
FIG. 1 is a perspective representation of the photoarray substrate with a member attached to the underside surface.

Referring to FIG 1, the semiconductor photoarray comprises a semiconductor substrate 10 having a principal light-sensitive surface 12 and a plurality of photoresponse components located within the substrate 10 and extending from the principal surface 12. A protective layer, 13 such as an oxide, overlies the principal surface 12. Located upon portions of the protective layer 13 are a plurality of spaced interconnect layers 14. Suitably, each interconnect layer 14 is electrically connnected to a selected active portion of the substrate 10.

A plurality of spaced contact bumps 16, preferably of conductive metal, such as a solder material, are located along the periphery of the substrate 10. The contact bumps can be formed by several different techniques known in the semiconductor art, such as solder reflow, thermocompression, or ultrasonic bonding. For a further description of the formation and use of contact bumps, reference may be made to US. Pat. application Ser. No. 770,215 filed Oct. 24, 1968 and assigned to the assignee of this application.

The interconnect layers 14 extend along the surface 12 to make electrical connection to the contact bumps 16, one interconnect layer 14 for each contact bump 16.

Preferably, and in order to provide for the dissipation of heat from the substrate 10, a member 20 is attached to another surface of the substrate 10, such as to the underside surface 22. The member 20 may comprise a conductive metal, such as copper or gold, whereupon by extending into the environment, member 20 provides a heat sink for the substrate 10. Member 20 can be attached to substrate 10 by soldering, so that a good hermetic seal is provided in addition to heat dissipation. The solder selected should be such that a similar coefficient of expansion exists between the solder and member 20, thereby preventing changes in ambient from creating stress between member 20 and the solder. For example, if the member 20 comprises nickel, copper or a compound of copper and gold, then a compatible solder material can comprise a compound of tin and lead, or tin and indium. On the other hand, if the member 20 comprises molybdenum or tungsten, then the solder may comprise a compound of gold and silicon, or gold and germanium.

Figure 2:
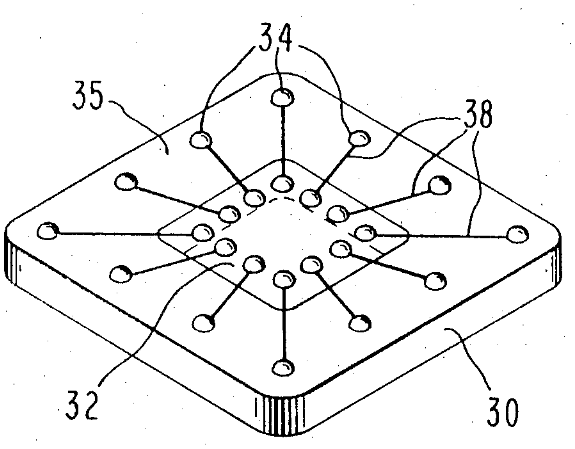
FIG. 2 is a perspective representation of the frame assembly including the frame and protective plate seated therein.

Referring to FIG. 2, a top plate assembly is shown comprising a frame 30 of a light, durable, nonconductive material, such as a ceramic. An opening extending through frame 30 is provided, which allows a protective plate 32 of highly transparent material to be located therein.

Preferably, plate 32 comprises a fiber optics material having a plurality of transmissive strands fused together with a high index of refraction along the parallel axis. Fiber optics glass is noted for its low optical transmission loss; typically, fiber optics material can transmit greater than 90 percent of the original light striking its surface. For example, depending upon the type of glass used, light having a wavelength of approximately 0.5 to 1.3 microns can be transmitted through a 6-inch fiber optics plate with the loss of original light less than ten percent. Furthermore, to prevent crosstalk due to diffused light, the fiber optics plate 32 preferably comprises columnated, absorbing, interstitial material, whereby light rays striking plate 32 substantially perpendicular thereto are transmitted through with negligible loss, whereas light rays striking at angles not substantially perpendicular to plate 32 are absorbed.

An appropriate sealing material, such as solder glass, is located in and fills the spacing between the frame 30 and plate 32.

A first plurality of spaced contact bumps 34 are located along the periphery of a surface 35 of the frame 30. A second plurality of spaced contact bumps 36 are located along the periphery of a corresponding surface of the plate 32. Preferably, the contact bumps comprise a conductive metal, such as a solder material, and can be formed in the manner described above for the substrate bumps of FIG. 1.

A plurality of spaced interconnect layers 38 extend along the surface of frame 30 and plate 32 between the first and second contact bump pluralities 34 and 36, one interconnect layer 38 corresponding to and making electrical connection with each contact bump pairs 34 and 36.

The interconnect layers 38 can be formed by one of several techniques commonly used in the semiconductor art. One approach comprises the well-known photolithographic technique. However, the preferred approach comprises a lifting technique wherein line resolution on the order of microns can be obtained, and is described in IS. Pat. application Ser. No. 509,825 filed Nov. 26, 1965, and assigned to the assignee of this invention. The above referenced approach contemplates the formation of a pattern of photoresist material over the surface of the frame 30 and plate 32. A layer of calcium fluoride, or other suitable lifting agent, is formed next over the photoresist pattern and the remaining uncovered surface. The photoresist pattern is then lifted, leaving a pattern of calcium fluoride. Next, a layer of conductive metal is deposited over the calcium fluoride pattern and uncovered portion of the surface. The calcium fluoride pattern is now lifted, leaving a desired pattern of spaced interconnect layers 38 upon the surface of frame 30 and plate 32.

Figure 3:
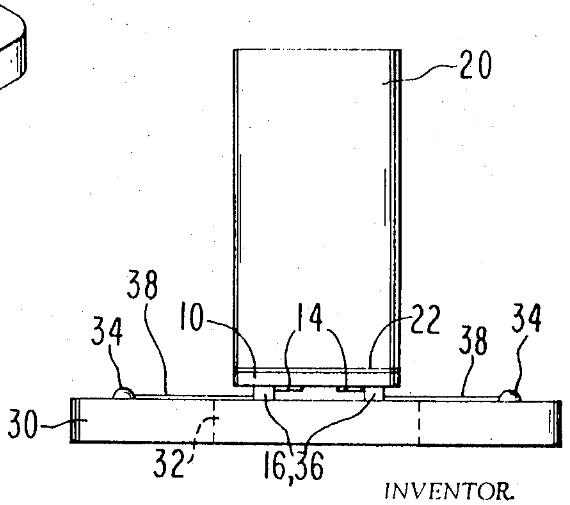
FIG. 3 is a perspective representation of the substrate attached to the frame assembly.

Referring to FIG. 3, the substrate 10 and member 20 are inverted and brought in contact with the frame 30 and plate 32 in such a manner that the contact bumps 16 along the periphery of the substrate 10 are aligned with the contact bumps 36 on the plate. The respective bump contacts 16 and 36 are then bonded together, suitably by a solder reflow technique, thereby joining the substrate 10 to the plate 32.

Figure 4:
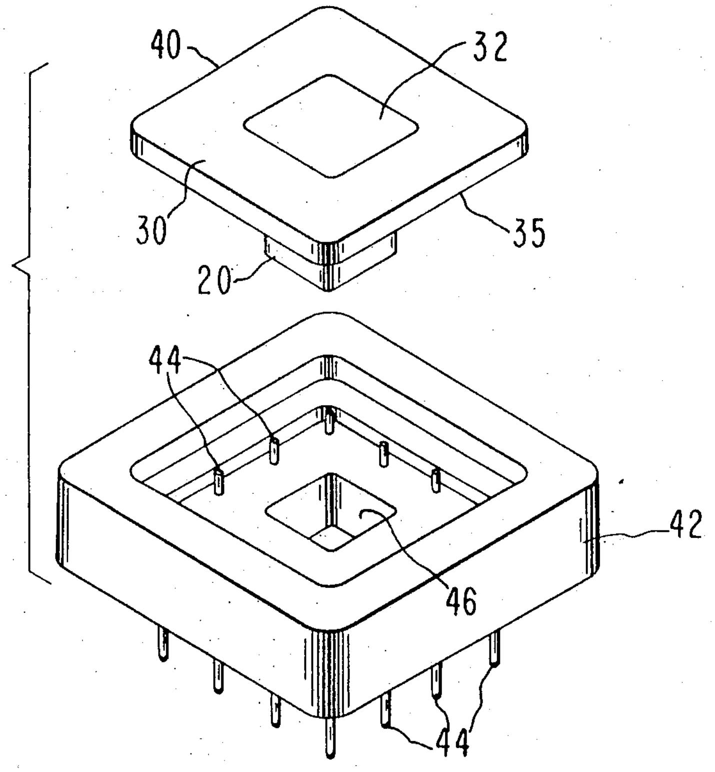
FIG. 4 is a perspective representation of the frame assembly just before insertion into the housing.

Referring to FIG. 4, the frame assembly 30 is inverted and inserted into a housing 42. Housing 42 contains a plurality of spaced terminal leads 44, whereby when the frame assembly (comprising the frame 30, plate 32, substrate 10, and member 20) is seated therein, the contact bumps 34 located along what is now the underside surface 35 of frame 30 are aligned with one end of the corresponding terminal leads 44. The contact bumps 34 are bonded to the corresponding ends of the terminal leads 44, so that electrical connection is provided between the terminal leads 44 and the interconnect layers 38 (shown in FIG. 2). External contact is thus provided via terminal leads 44 to selected active areas in the substrate.

The housing 42 may comprise a dielectric material, such as plastic or ceramic. In the case of plastic, the terminal leads 44 can be gold or nickel-plated, and molded in place in the plastic housing 42. If the housing comprises metal, electrical isolation must be provided between the terminal leads 44 and housing 42. Sufficient isolation is conveniently provided by a glass material that is fused between the terminal leads 44 and the housing 42.

An opening 46 is provided in the housing 42 to allow member 20 to extend therethrough to the atmosphere thereunder, whereby air may flow past the extended portion of member 20 and allow it to cool. Heat generated in the enclosed substrate 10 is thus transferred through the member 20 and then out into the environment surrounding the extended portion of member 20 below housing 42.

Figures 5, 6:
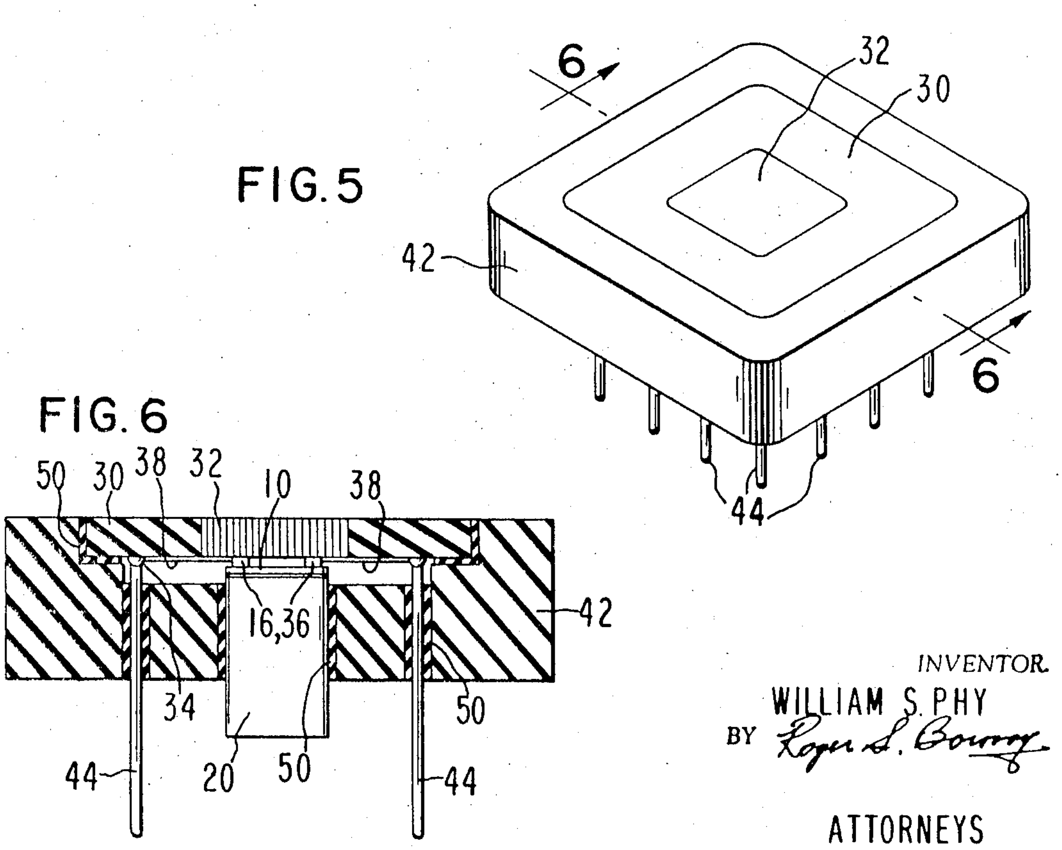
FIG. 5 is a perspective representation of the complete package.
FIG. 6 is a simplified cross-sectional view of the package of FIG. 5 along the lines 5—5.

Referring to FIGS. 5 and 6, hermetic seal of the final package is provided by a potting material 50, such as epoxy, silicone, or equivalent thereof, which is located in the cracks between the housing 16 and frame assembly 30, and between the housing 16 and member 20.

I claim:

1. Apparatus comprising:
- a semiconductor substrate having a principal light sensitive surface and a first plurality of contact bumps thereon;
- means for protecting the principle surface of said substrate from mechanical damage while permitting light to reach said surface, said means for protecting comprising a protective layer of highly transparent, columnated interstitial fiber optics material capable of transmitting light impinging thereon in a substantially perpendicular direction, while absorbing light impinging thereon other than in a substantially perpendicular direction, said protective layer overlying the principal surface;
- a frame with an opening extending therethrough with at least a portion of the protective layer located within and attached to the frame,
- means, attached to said frame and said protective layer, for making a plurality of separate electrical connections to selected portions of said semiconductor substrate, said means for making contacting at least some of said first plurality of contact bumps, said means for making comprising a second plurality of contact bumps interposed between the semiconductor substrate and the protective material and another plurality of contact bumps interposed between the frame and a housing means; and housing means in support relationship to said frame 2. Apparatus as recited in claim 1 wherein each of the spaced interconnect layers extends between and is electrically connected to a contact bump on the protective layer and to a corresponding contact bump on the frame, the apparatus further defined by a plurality of separate terminal leads located in the housing, each terminal lead extending to make electrical connection to a contact bump on the frame, the terminal leads extending through the housing to provide for a plurality of external connections.

3. Apparatus as recited in claim 2 further defined by a support member attached to the semiconductor substrate and extending through the housing to provide for dissipation of substrate heat.

4. Apparatus comprising:
- a semiconductor substrate having a principal light-sensitive surface;
- a first plurality of contact bumps located along and attached to selected portions of the principal surface;
- a highly transparent protective layer of fiber optics material having an upper and lower surface overlying the principal surface;
- a frame having an upper and lower surface and an opening extending therethrough, at least a portion of the protective layer located within the opening;
- a second plurality of contact bumps located along and attached to the lower surface of the frame;
- a plurality of spaced interconnect layers extending along the lower surface of the protective layer and the frame, each layer making electrical contact to one of the bumps of the first plurality and to one of the bumps of the second plurality;
- a housing in support relationship to the frame;
- a plurality of spaced terminal leads extending through the housing, each terminal lead making electrical connection to a respective contact bump in the second plurality, whereby external contact is provided for selected portions of the substrate surface; and,
- a member attached to another surface of the substrate and extending through the housing to provide for dissipation of substrate heat.

* * * * *